(12) United States Patent
Liu

(10) Patent No.: US 9,461,074 B2
(45) Date of Patent: Oct. 4, 2016

(54) MOTHERBOARD, ARRAY SUBSTRATE AND FABRICATION METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventor: Xu Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 13 days.

(21) Appl. No.: 14/432,025

(22) PCT Filed: May 20, 2014

(86) PCT No.: PCT/CN2014/077920
§ 371 (c)(1),
(2) Date: Mar. 27, 2015

(87) PCT Pub. No.: WO2015/096360
PCT Pub. Date: Jul. 2, 2015

(65) Prior Publication Data
US 2016/0027800 A1    Jan. 28, 2016

(30) Foreign Application Priority Data

Dec. 27, 2013 (CN) .......................... 2013 1 0741386

(51) Int. Cl.
*H01L 29/10* (2006.01)
*H01L 27/12* (2006.01)
*G02F 1/1345* (2006.01)
(Continued)

(52) U.S. Cl.
CPC ........... *H01L 27/124* (2013.01); *G02F 1/1343* (2013.01); *G02F 1/1345* (2013.01); *H01L 27/1259* (2013.01); *G02F 1/136227* (2013.01); *H01L 2924/0002* (2013.01)

(58) Field of Classification Search
CPC .................... H01L 27/124; H01L 2924/0002; H01L 27/1259; G02F 1/1345; G02F 1/1343; G02F 1/136227
USPC ................... 257/48, 59, 72, 49; 438/151, 30
See application file for complete search history.

(56) References Cited

U.S. PATENT DOCUMENTS 5,276,384 A     1/1994  Martin
8,030,103 B2   10/2011  Park et al.
(Continued)

FOREIGN PATENT DOCUMENTS

CN    202171704 U    3/2012
CN    102403311 A    4/2012
(Continued)

OTHER PUBLICATIONS

International Search Report and Written Opinion dated Oct. 10, 2014; PCT/CN2014/077920.
(Continued)

*Primary Examiner* — Long K Tran
(74) *Attorney, Agent, or Firm* — Ladas & Parry LLP

(57) ABSTRACT

An array substrate and a fabrication method thereof, a display device including the array substrate and a motherboard including the array substrate are provided. The array substrate includes a pixel region and a peripheral wiring region. The peripheral wiring region includes a transparent conductive contact electrode disposed on a base substrate. The transparent conductive contact electrode is electrically connected with a metal electrode line disposed below the transparent conductive contact electrode through via holes disposed in different insulating layers, and the via holes disposed in different insulating layers do not overlap with each other in a projection direction.

19 Claims, 6 Drawing Sheets

(51) Int. Cl.
*G02F 1/1343* (2006.01)
*G02F 1/1362* (2006.01)

(56) References Cited

U.S. PATENT DOCUMENTS

| | | | |
|---|---|---|---|
| 8,278,648 B2 * | 10/2012 | Choi | H01L 51/0096 257/40 |
| 2007/0152217 A1 * | 7/2007 | Lai | H01L 27/1225 257/59 |
| 2010/0173433 A1 | 7/2010 | Park et al. | |
| 2011/0037068 A1 * | 2/2011 | Yamazaki | H01L 27/1225 257/43 |

FOREIGN PATENT DOCUMENTS

| | | |
|---|---|---|
| CN | 102929059 A | 2/2013 |
| CN | 103728804 A | 4/2014 |

OTHER PUBLICATIONS

International Search Report mailed Oct. 10, 2014; PCT/CN2014/077920.

Written Opinion of the International Searching Authority; mailed Oct. 10, 2014; PCT/CN2014/077920.

* cited by examiner

MOTHERBOARD, ARRAY SUBSTRATE AND FABRICATION METHOD THEREOF, AND DISPLAY DEVICE

TECHNICAL FIELD

Embodiments of the disclosure relate to a motherboard, an array substrate and a fabrication method thereof, and a display device.

BACKGROUND

Currently, Liquid Crystal Display (LCD) has become a major trend in display field. An array substrate of the LCD comprises a pixel region and a peripheral wiring region surrounding the pixel region, the peripheral wiring region is configured for connecting with a drive IC, testing and preventing static electricity, etc.; and the peripheral wiring region is provided with a variety of metal wirings. Due to the limitation of the arrangement manner and the arrangement space of the metal wirings, via holes are generally employed to connect the metal wirings provided in different layers; however, a corrosion phenomenon often occurs at the locations of the via holes.

For example, a gate line lead in the peripheral wiring region and a gate electrode in the pixel region are provided in the same layer and are formed simultaneously. The gate line lead in the peripheral wiring region is often buried under the surface of the array substrate and the gate line lead needs to be connected with the drive IC; to this end, a metal oxide conductive electrode with relatively strong corrosion resistance is provided on the surface of the array substrate and a via hole is provided in an insulating layer below the metal oxide conductive electrode so that the metal oxide conductive electrode is electrically connected with the gate line lead below the via hole and the gate line lead is connected with the drive IC through the via hole and the metal oxide conductive electrode.

Although the corrosion resistance of the metal oxide conductive electrode exposed in the air is relatively strong, yet water vapor in the air will inevitably permeate into the metal oxide conductive electrode and arrive at the gate line lead through the via hole to cause corrosion to the metal gate line lead. Thus, a yield of the array substrate is reduced.

SUMMARY

In one aspect, embodiments of the present disclosure provide an array substrate. The array substrate comprises a pixel region and a peripheral wiring region. The peripheral wiring region comprises a transparent conductive contact electrode disposed on a base substrate, the transparent conductive contact electrode is electrically connected with a metal electrode line disposed below the transparent conductive contact electrode through via holes disposed in different insulating layers, and the via holes disposed in different insulating layers do not overlap with each other in a projection direction.

For example, the pixel region comprises a thin film transistor comprising a gate electrode, a source electrode and a drain electrode, a common electrode and a pixel electrode electrically connected with the drain electrode of the thin film transistor disposed on the base substrate; and the transparent conductive contact electrode is disposed in a same layer with either the pixel electrode or the common electrode which is provided above.

For example, the pixel region further comprises a data line and a gate line disposed on the base substrate; and the metal electrode line comprises an extension line of the gate line and/or an extension line of the data line.

For example, the thin film transistor is a thin film transistor of bottom gate type; the extension line of the gate line is a gate line lead, and the gate line lead is disposed in a same layer with the gate line and the gate electrode of the thin film transistor; the transparent conductive contact electrode is electrically connected with a source-drain electrode reserved pattern through a first via hole disposed in a passivation layer, and the source-drain electrode reserved pattern is electrically connected with the gate line lead through a second via hole disposed in a gate insulating layer; the passivation layer is provided in the pixel region and the peripheral wiring region, the passivation layer is provided between the pixel electrode and the common electrode in the pixel region, and the source-drain electrode reserved pattern is disposed in a same layer with the source electrode and the drain electrode; and the gate insulating layer is provided in the pixel region and the peripheral wiring region, the gate insulating layer is provided between the gate electrode and the source electrode as well as the drain electrode in the pixel region.

For example, the thin film transistor is a thin film transistor of bottom gate type; the extension line of the gate line is a gate line lead, and the gate line lead is disposed in a same layer with the gate line and the gate electrode of the thin film transistor; the transparent conductive contact electrode is electrically connected with a first transparent electrode reserved pattern through a third via hole disposed in a passivation layer, and the first transparent electrode reserved pattern is electrically connected with the gate line lead through a fourth via hole disposed in a gate insulating layer; the passivation layer is provided in the pixel region and the peripheral wiring region, the passivation layer is provided between the pixel electrode and the common electrode in the pixel region, and the first transparent electrode reserved pattern is disposed in a same layer with either the pixel electrode or the common electrode which is provided below; and the gate insulating layer is provided in the pixel region and the peripheral wiring region, and the gate insulating layer is provided between the gate electrode and the source electrode as well as the drain electrode in the pixel region.

For example, the thin film transistor is a thin film transistor of bottom gate type; the extension line of the data line is a data line lead, and the data line lead is disposed in a same layer with the data line, and the source electrode and the drain electrode of the thin film transistor; the transparent conductive contact electrode is electrically connected with a second transparent electrode reserved pattern through a fifth via hole disposed in a passivation layer, and the second transparent electrode reserved pattern is electrically connected with the data line lead through a sixth via hole disposed in a protective layer; the passivation layer is provided in the pixel region and the peripheral wiring region, and the passivation layer is provided between the pixel electrode and the common electrode in the pixel region; the second transparent electrode reserved pattern is disposed in a same layer with either the pixel electrode or the common electrode which is provided below; and the protective layer is provided in the pixel region and the peripheral wiring region, and the protective layer is provided between the source electrode as well as the drain electrode and either the pixel electrode or the common electrode which is provided below.

For example, the thin film transistor is a thin film transistor of top gate type; the extension line of the data line is a data line lead, and the data line lead is disposed in a same layer with the data line, and the source electrode and the drain electrode of the thin film transistor; the transparent conductive contact electrode is electrically connected with a gate electrode reserved pattern through a seventh via hole disposed in a passivation layer, and the gate electrode reserved pattern is electrically connected with the data line lead through an eighth via hole disposed in a gate insulating layer; the passivation layer is provided in the pixel region and the peripheral wiring region, and the passivation layer is provided above the gate electrode in the pixel region; the gate electrode reserved pattern is disposed in a same layer with the gate electrode; and the gate insulating layer is provided in the pixel region and the peripheral wiring region, and the gate insulating layer is provided between the gate electrode and the source electrode as well as the drain electrode in the pixel region.

For example, the transparent conductive contact electrode is disposed in a same layer with the common electrode; and the pixel electrode is disposed between the common electrode and the base substrate.

For example, the transparent conductive contact electrode is disposed in a same layer with the pixel electrode; and the common electrode is disposed between the pixel electrode and the base substrate.

In another aspect, the embodiments of the present disclosure further provide a fabrication method of the above-described array substrate. The method comprises: forming a metal electrode line and a transparent conductive contact electrode provided above the metal electrode line in a peripheral wiring region surrounding a pixel region of a base substrate. The transparent conductive contact electrode is electrically connected with the metal electrode line through via holes provided in different insulating layers, and the via holes provided in different insulating layers do not overlap with each other in a projection direction.

For example, the fabrication method further comprises: forming a thin film transistor comprising a gate electrode, a source electrode and a drain electrode, a common electrode and a pixel electrode electrically connected with the drain electrode of the thin film transistor in the pixel region of the base substrate. The transparent conductive contact electrode is formed in a same layer with either the pixel electrode or the common electrode which is provided above.

For example, the forming the metal electrode line in the peripheral wiring region of the base substrate comprises: forming an extension line of a gate line and/or an extension line of a data line in the peripheral wiring region of the base substrate.

For example, the fabrication method comprises: forming a gate metal layer comprising the gate electrode and the gate line provided in the pixel region and a gate line lead provided in the peripheral wiring region on the base substrate, wherein the gate line lead is the extension line of the gate line; forming a gate insulating layer provided in the pixel region and the peripheral wiring region and an active layer provided in the pixel region sequentially on the base substrate where the gate metal layer has been formed; wherein a second via hole provided in the peripheral wiring region is formed in the gate insulating layer and the second via hole exposes the gate line lead; forming a source-drain metal layer comprising the source electrode, the drain electrode and the data line electrically connected with the source electrode provided in the pixel region and a source-drain electrode reserved pattern provided in the peripheral wiring region on the base substrate where the gate insulating layer and the active layer have been formed; wherein the source-drain electrode reserved pattern is electrically connected with the gate line lead through the second via hole; forming a passivation layer on the base substrate where the source-drain metal layer has been formed; wherein a first via hole provided in the peripheral wiring region is formed in the passivation layer and the first via hole exposes the source-drain electrode reserved pattern; and forming a first transparent electrode provided in the pixel region and the transparent conductive contact electrode provided in the peripheral wiring region on the base substrate where the passivation layer has been formed, wherein the transparent conductive contact electrode is electrically connected with the source-drain electrode reserved pattern through the first via hole. Before forming the passivation layer, the fabrication method further comprises: forming a second transparent electrode provided in the pixel region on the base substrate; one of the first transparent electrode and the second transparent electrode is the pixel electrode, and the other is the common electrode.

For example, the fabrication method comprises: forming a gate metal layer comprising the gate electrode and the gate line provided in the pixel region and a gate line lead provided in the peripheral wiring region on the base substrate, wherein the gate line lead is the extension line of the gate line; forming a gate insulating layer provided in the pixel region and the peripheral region and an active layer provided in the pixel region sequentially on the base substrate where the gate metal layer has been formed; wherein a fourth via hole provided in the peripheral wiring region is formed in the gate insulating layer, and the fourth via hole exposes the gate line lead; forming a source-drain metal layer comprising the source electrode, the drain electrode and the data line electrically connected with the source electrode provided in the pixel region on the base substrate where the gate insulating layer and the active layer have been formed; forming a first transparent electrode provided in the pixel region and a first transparent electrode reserved pattern provided in the peripheral wiring region on the base substrate where the source-drain metal layer has been formed; wherein the first transparent electrode reserved pattern is electrically connected with the gate line lead through the fourth via hole; forming a passivation layer on the base substrate where the first transparent electrode and the first transparent electrode reserved pattern have been formed; wherein a third via hole provided in the peripheral wiring region is formed in the passivation layer, and the third via hole exposes the first transparent electrode reserved pattern; and forming a second transparent electrode provided in the pixel region and the transparent conductive contact electrode provided in the peripheral wiring region on the base substrate where the passivation layer has been formed; wherein the transparent conductive contact electrode is electrically connected with the first transparent electrode reserved pattern through the third via hole. One of the first transparent electrode and the second transparent electrode is the pixel electrode, and the other is the common electrode.

For example, the fabrication method comprises: forming a gate metal layer comprising the gate electrode and the gate line provided in the pixel region on the base substrate; forming a gate insulating layer provided in the pixel region and the peripheral region and an active layer provided in the pixel region sequentially on the base substrate where the gate metal layer has been formed; forming a source-drain metal layer comprising the source electrode, the drain elec-trode and the data line electrically connected with the source electrode provided in the pixel region and a data line lead provided in the peripheral wiring region on the base substrate where the gate insulating layer and the active layer have been formed, wherein the data line lead is the extension line of the data line; forming a protective layer on the base substrate where the source-drain metal layer has been formed; wherein a sixth via hole provided in the peripheral wiring region is formed in the protective layer, and the sixth via hole exposes the data line lead; forming a second transparent electrode provided in the pixel region and a second transparent electrode reserved pattern provided in the peripheral wiring region on the base substrate where the protective layer has been formed; forming a passivation layer on the base substrate where the second transparent electrode and the second transparent electrode reserved pattern have been formed; wherein a fifth via hole provided in the peripheral wiring region is formed in the passivation layer, and the fifth via hole exposes the second transparent electrode reserved pattern; and forming a first transparent electrode provided in the pixel region and the transparent conductive contact electrode provided in the peripheral wiring region on the base substrate where the passivation layer has been formed, wherein the transparent conductive contact electrode is electrically connected with the second transparent electrode reserved pattern through the fifth via hole. One of the first transparent electrode and the second transparent electrode is the pixel electrode, and the other is the common electrode.

For example, the fabrication method comprises: forming a source-drain metal layer comprising the source electrode, the drain electrode and the data line connected with the source electrode provided in the pixel region and a data line lead provided in the peripheral wiring region on the base substrate, wherein the data line lead is the extension line of the data line; forming an active layer provided in the pixel region and a gate insulating layer provided in the pixel region and the peripheral region sequentially on the base substrate where the source-drain metal layer has been formed; wherein an eighth via hole provided in the peripheral wiring region is formed in the gate insulating layer, and the eighth via hole exposes the data line lead; forming a gate metal layer comprising the gate electrode and the gate line provided in the pixel region and a gate electrode reserved pattern provided in the peripheral wiring region on the base substrate where the gate insulating layer has been formed; forming a passivation layer on the base substrate where the gate metal layer has been formed; wherein a seventh via hole provided in the peripheral wiring region is formed in the passivation layer, and the seventh via hole exposes the gate electrode reserved pattern; and forming a first transparent electrode provided in the pixel region and the transparent conductive contact electrode provided in the peripheral wiring region on the base substrate where the passivation layer has been formed, wherein the transparent conductive contact electrode is electrically connected with the gate electrode reserved pattern through the seventh via hole. Before forming the passivation layer, the fabrication method further comprises: forming a second transparent electrode provided in the pixel region on the base substrate; and one of the first transparent electrode and the second transparent electrode is the pixel electrode, and the other is the common electrode.

In still another aspect, the embodiments of the present disclosure further provide a display device. The display device comprises the array substrate as described above.

In still another aspect, the embodiments of the present disclosure further provide a motherboard. The motherboard comprises at least one array substrate as described above.

For example, the motherboard further comprises: a test gate line in parallel with a data line of the array substrate, and electrically connected with a transparent conductive contact electrode; and/or, a test data line in parallel with a gate line of the array substrate, and electrically connected with the transparent conductive contact electrode. The test gate line and/or the test data line are disposed in a same layer with the transparent conductive contact electrode.

For example, the test gate line and the test data line are electrically connected with each other.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
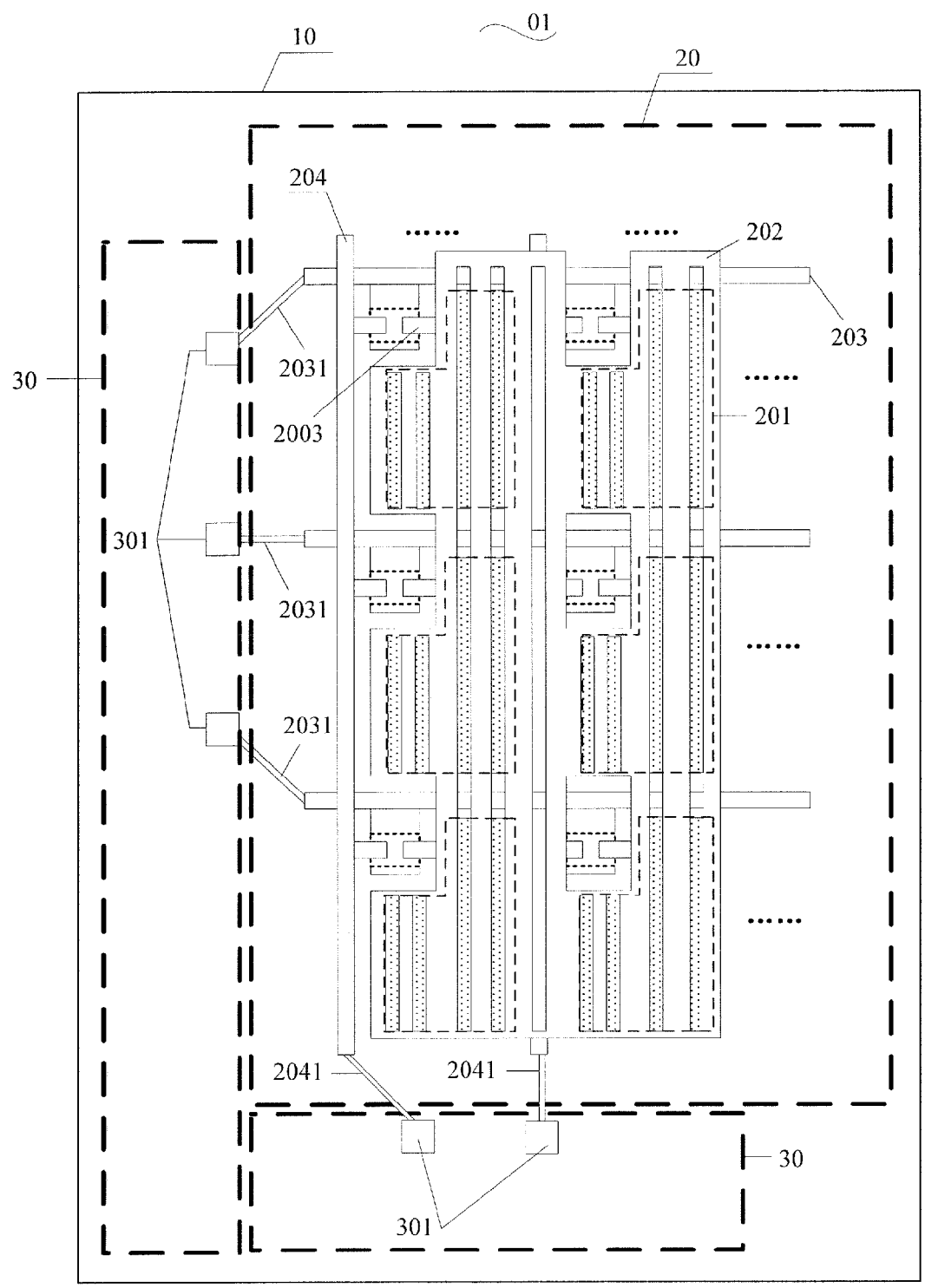
FIG. 1 is a top-view illustrating an array substrate according to embodiments of the present disclosure.

Embodiments of the present disclosure provide an array substrate 01. As shown in FIG. 1, the array substrate comprises a pixel region 20 and a peripheral wiring region 30; the peripheral wiring region 30 comprises a transparent conductive contact electrode 301 disposed on a base substrate 10; the transparent conductive contact electrode 301 is electrically connected with a metal electrode line disposed below the transparent conductive contact electrode 301 through via holes disposed in different insulating layers; and the via holes disposed in different insulating layers do not overlap with each other in a projection direction.

It should be noted that, in the embodiments of the present disclosure, the projection direction is a direction perpendicular to the array substrate 01 (i.e., a normal direction of the array substrate 01). In addition, since the transparent conductive contact electrode 301 is electrically connected with the metal electrode line disposed below the transparent conductive contact electrode 301 through the via holes disposed in different insulating layers, a conductive layer for example is further disposed between adjacent insulating layers; in this way, for example, the transparent conductive contact electrode 301 is electrically connected with the conductive layer through the via hole in a first insulating layer which is disposed below and is in direct contact with the transparent conductive contact electrode 301, and the conductive layer is then electrically connected with the metal electrode line through the via hole in a second insulating layer which is disposed below the conductive layer.

Here, the formation manner of the conductive layer is not limited. For the purpose of reducing the number of the patterning processes for fabricating the array substrate 01, the conductive layer between adjacent insulating layers according to the embodiments of the present disclosure and a conductive pattern in the pixel region 20 for example are formed simultaneously.

It should be noted that, the formation manner of the insulating layer provided in the peripheral wiring region 30 is not limited; and for example, the insulating layer in the peripheral wiring region 30 and the insulating layer in the pixel region 20 are formed simultaneously.

Figure 2:
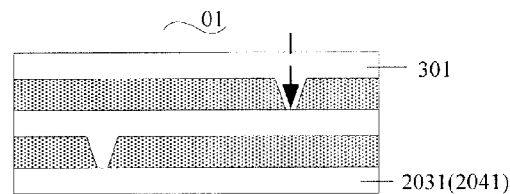
FIG. 2 is a cross-sectional view at via holes in a peripheral wiring region of the array substrate according to the embodiments of the present disclosure.

It should be noted that the structure of the metal electrode line is not limited by the embodiments of the present disclosure; and for example, the metal electrode line is an extension line 2031 of a gate line and/or an extension line 2041 of a data line and the gate line and the data line are provided in the pixel region 20, as shown in FIG. 2.

According to the embodiments of the disclosure, the array substrate 01 comprises the pixel region 20 and the peripheral wiring region 30 provided on the base substrate 10; the peripheral wiring region 30 comprises the transparent conductive contact electrode 301 disposed on the base substrate 10; the transparent conductive contact electrode 301 is electrically connected with the metal electrode line disposed below the transparent conductive contact electrode 301 through the via holes disposed in different insulating layers; and the via holes disposed in different insulating layers do not overlap with each other in the projection direction.

With reference to FIG. 2, in the case that water vapor permeates into the transparent conductive contact electrode 301 exposed outside along a direction as shown by an arrow in the diagram, there are limited molecules of water vapor able to permeate into the via hole in direct contact with the transparent conductive contact electrode 301 through the transparent conductive contact electrode 301 due to a very small cross-sectional area of the via hole; and since the via hole provided below and the via hole provided above do not overlap with each other in the vertical direction, it is difficult for the limited molecules of the water vapor permeating into the via hole provided above to arrive at the via hole provided below, so that the corrosion of the metal electrode line 2031 (2041) is avoided.

With reference to FIG. 1, the pixel region 20 for example comprises a plurality of pixel units, each pixel unit comprises a thin film transistors, a common electrode 202 and a pixel electrode 201 disposed on the base substrate 10, the pixel electrode is electrically connected with a drain electrode 2003 of the thin film transistor; the transparent conductive contact electrode 301 is disposed in a same layer with either the pixel electrode 201 or the common electrode 202 which is provided above.

Here, the expression "the transparent conductive contact electrode 301 is disposed in the same layer with either the pixel electrode 201 or the common electrode 202 which is provided above" refers to that: (1) in a case where the pixel electrode 201 is disposed above the common electrode 202, the transparent conductive contact electrode 301 is disposed in the same layer with the pixel electrode 201, and for example the transparent conductive contact electrode 301 and the pixel electrode 201 are formed by a single patterning process in order to avoid an increase of the number of patterning process; and (2) in a case where the common electrode 202 is disposed above the pixel electrode 201, the transparent conductive contact electrode 301 is disposed in the same layer with the common electrode 202, and for example the transparent conductive contact electrode 301 and the common electrode 202 are formed by a single patterning process in order to avoid an increase of the number of patterning process.

In addition, those skilled in the art should understand that, FIG. 1 only illustrates the case where the common electrode 202 is disposed above the pixel electrode 201 as an example; however, relative positions between the pixel electrode 201 and the common electrode 202 will not be limited by the embodiments of the present disclosure.

Further, the pixel region 20 comprises the data line 204 and the gate line 203 disposed on the base substrate 10, the data line 204 and the gate line 203 intersect with each other to define the pixel unit; and the metal electrode line comprises the extension line 2031 of the gate line and/or the extension line 2041 of the data line.

It should be noted that, the expression "the metal electrode line comprises the extension line 2031 of the gate line and/or the extension line 2041 of the data line" as described above refers to that: different peripheral wiring regions 30 may be disposed in a periphery of the pixel region 20; that is, in one type of the peripheral wiring region 30, the transparent conductive contact electrode 301 is electrically connected with the extension line 2031 of the gate line, and in the other type of the peripheral wiring region 30, the transparent conductive contact electrode 301 is electrically connected with the extension line 2041 of the data line. Depending on roles of the peripheral wiring regions 30, the same array substrate 01 may comprise one of the two peripheral wiring regions 30 as described above or both of the two peripheral wiring regions 30 as described above.

Thus, a range of the pixel region 20 is defined by a plurality of gate lines 203 and a plurality of data lines 204 intersecting with each other, the pixel unit is defined by two adjacent gate lines 203 and two adjacent data lines 204 intersecting with each other, and each pixel unit comprises the thin film transistor, the pixel electrode 201 electrically connected with the drain electrode 2003 of the thin film transistor, and the common electrode 202.

Figure 3:
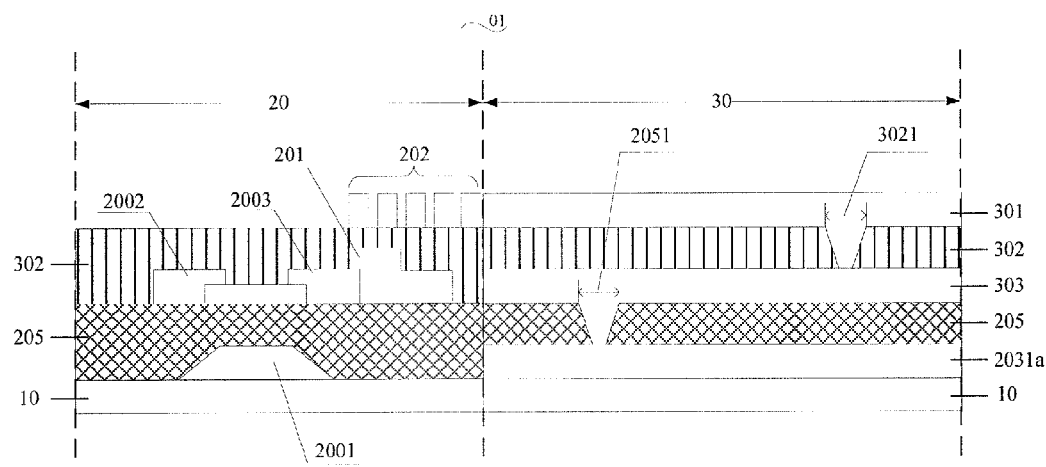
FIG. 3 is a cross-sectional view I illustrating a pixel region and via holes in the peripheral wiring region of the array substrate according to the embodiments of the present disclosure.
Figure 4:
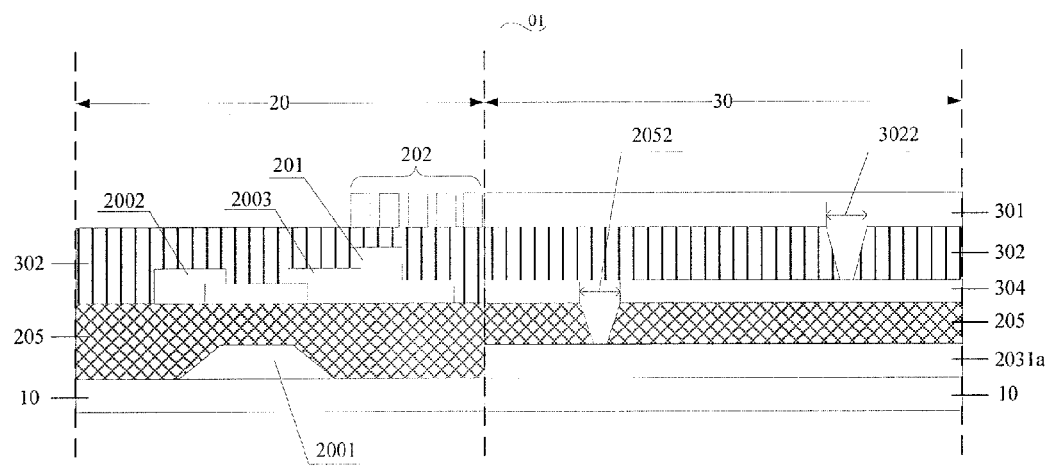
FIG. 4 is a cross-sectional view II illustrating the pixel region and the via holes in the peripheral wiring region of the array substrate according to the embodiments of the present disclosure.

In addition, in a case where the thin film transistor is a thin film transistor of bottom gate type, the extension line of the gate line is a gate line lead 2031a and in a case where the gate line lead 2031a is disposed in a same layer with the gate line 203 and a gate electrode 2001 of the thin film transistor, the array substrate according to the embodiments of the disclosure may further have the structures shown in FIG. 3 and FIG. 4.

(1) Optionally, as shown in FIG. 3, the transparent conductive contact electrode 301 is electrically connected with a source-drain electrode reserved pattern 303 through a first via hole 3021 disposed in a passivation layer 302, and the source-drain electrode reserved pattern 303 is electrically connected with the gate line lead 2031a through a second via hole 2051 disposed in a gate insulating layer 205.

The passivation layer 302 is provided in the pixel region 20 and the peripheral wiring region 30, and the passivation layer 302 is provided between the pixel electrode 201 and the common electrode 202 in the pixel region 20; the source-drain electrode reserved pattern 303 is disposed in a same layer with the source electrode and the drain electrode; the gate insulating layer 205 is provided in the pixel region 20 and the peripheral wiring region 30, and the gate insulating layer 205 is provided between the gate electrode 2001 and the source electrode 2002 as well as the drain electrode 2003 in the pixel region 20.

The transparent conductive contact electrode 301 is electrically connected with the source-drain electrode reserved pattern 303 through the first via hole 3021 in the passivation layer 302, the source-drain electrode reserved pattern 303 is electrically connected with the gate line lead 2031a through the second via hole 2051 in the gate insulating layer 205, and the first via hole 3021 and the second via hole 2051 do not overlap with each other in the vertical direction. Thus, the water vapor is prevented from corroding the gate line lead 2031a in the case that the water vapor permeates into the transparent conductive contact electrode 301.

Since it is difficult for the water vapor permeating into the transparent conductive contact electrode 301 to pass through the two via holes (which do not overlapped with each other in the vertical direction) so as to arrive at the gate line lead 2031a, the gate line lead 2031a may be made of a metal alloy which has relatively strong corrosion resistance, such as an aluminum-neodymium alloy; or the gate line lead 2031a may be made of a metal element which has relatively weak corrosion resistance, such as molybdenum. In addition, since the source-drain electrode reserved pattern 303 is connected with the transparent conductive contact electrode 301 only through the first via hole 3021 so that the water vapor permeating into the transparent conductive contact electrode 301 may corrode the source-drain electrode reserved pattern 303, the source-drain electrode reserved pattern 303 may be made of a metal alloy which has relatively strong corrosion resistance, such as aluminum-neodymium alloy.

(2) Optionally, as shown in FIG. 4, the transparent conductive contact electrode 301 is electrically connected with a first transparent electrode reserved pattern 304 through a third via hole 3022 disposed in the passivation layer 302, and the first transparent electrode reserved pattern 304 is electrically connected with the gate line lead 2031a through a fourth via hole 2052 disposed in the gate insulating layer 205.

The passivation layer 302 is provided in the pixel region 20 and the peripheral wiring region 30, and the passivation layer 302 is provided between the pixel electrode 201 and the common electrode 202 in the pixel region 20; the first transparent electrode reserved pattern 304 is disposed in a same layer with either the pixel electrode 201 or the common electrode 202 which is provided below (for example, in FIG. 4, the first transparent electrode reserved pattern 304 is disposed in a same layer with the pixel electrode 201); the gate insulating layer 205 is provided in the pixel region 20 and the peripheral wiring region 30, and the gate insulating layer 205 is provided between the gate electrode 2001 and the source electrode 2002 as well as the drain electrode 2003 in the pixel region 20.

It should be noted that FIG. 4 only illustrates a case where the common electrode 202 is disposed above the pixel electrode 201 as an example; and in this case, the common electrode 202 is disposed above and the pixel electrode 201 is disposed below, the transparent conductive contact electrode 301 is disposed in a same layer with the common electrode 202, and the first transparent electrode reserved pattern 304 is disposed in a same layer with the pixel electrode 201.

The transparent conductive contact electrode 301 is electrically connected with the first transparent electrode reserved pattern 304 through the third via hole 3022 in the passivation layer 302, the first transparent electrode reserved pattern 304 is electrically connected with the gate line lead 2031a through the fourth via hole 2052 in the gate insulating layer 205, and the third via hole 3022 and the fourth via hole 2052 do not overlap in a vertical direction. Thus, the water vapor is prevented from corroding the gate line lead 2031a in the case that the water vapor permeates into the transparent conductive contact electrode 301.

The gate line lead 2031a may be made of the metal alloy which has relatively strong corrosion resistance such as the aluminum-neodymium alloy, or may be made of the metal element which has relatively weak corrosion resistance such as molybdenum. In addition, the transparent electrode is generally made of a transparent material such as Indium Tin Oxide (ITO), which has relatively high corrosion resistance per se; and thus, the material of the first transparent electrode reserved pattern 304 is not limited in the embodiments of the disclosure. In order to reduce the number of patterning processes, the material of the first transparent electrode reserved pattern 304 for example is the same as that of the pixel electrode 201 or the common electrode 202, so that the first transparent electrode reserved pattern 304 as well as the pixel electrode 201 or the common electrode 202 disposed in the same layer with the first transparent electrode reserved pattern 304 are formed by a single patterning process.

Figure 5:
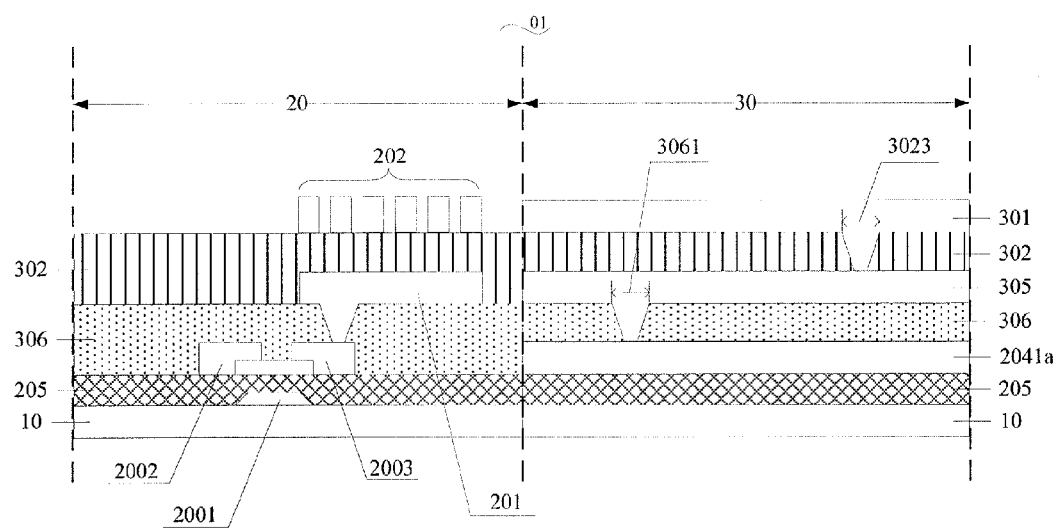
FIG. 5 is a cross-sectional view III illustrating the pixel region and the via holes in the peripheral wiring region of the array substrate according to the embodiments of the present disclosure.

In a case where the thin film transistor is the thin film transistor of bottom gate type; the extension line of the data line is a data line lead 2041a; and the data line lead 2041a is disposed in a same layer with the data line 204, the source electrode 2002 and the drain electrode 2003 of the thin film transistor, the array substrate according to the embodiments of the disclosure may further have the structures shown in FIG. 5

As shown in FIG. 5, the transparent conductive contact electrode 301 is electrically connected with a second transparent electrode reserved pattern 305 through a fifth via hole 3023 disposed in the passivation layer 302, and the second transparent electrode reserved pattern 305 is electrically connected with the data line lead 2041a through a sixth via hole 3061 disposed in a protective layer 306.

The passivation layer 302 is provided in the pixel region 20 and the peripheral wiring region 30, and the passivation layer 302 is provided between the pixel electrode 201 and the common electrode 202 in the pixel region 20; the second transparent electrode reserved pattern 305 is disposed in a same layer with either the pixel electrode 201 or the common electrode 202 which is disposed below; and the protective layer 306 is provided in the pixel region 20 and the peripheral wiring region 30, and the protective layer 306 is provided between the source electrode as well as the drain electrode and either the pixel electrode 201 or the common electrode 202 which is provided below.

It should be noted that, FIG. 5 only illustrates a case where the common electrode 202 is disposed above the pixel electrode 201 as an example; in this case, the common electrode 202 is disposed above and the pixel electrode 201 is disposed below, the transparent conductive contact electrode 301 is disposed in a same layer with the common electrode 202, and the second transparent electrode reserved pattern 305 is disposed in a same layer with the pixel electrode 201; and the protective layer 306 is provided between the source electrode 2002 as well as the drain electrode 2003 and pixel electrode 201.

The transparent conductive contact electrode 301 is electrically connected with the second transparent electrode reserved pattern 305 through the fifth via hole 3023 in the passivation layer 302, the second transparent electrode reserved pattern 305 is electrically connected with the data line lead 2041a through the sixth via hole 3061 in the protective layer 306, and the fifth via hole 3023 and the sixth via hole 3061 do not overlap in the vertical direction. Thus, the water vapor is prevented from corroding the data line lead 2041a in the case that the water vapor permeates into the transparent conductive contact electrode 301.

Figure 6:
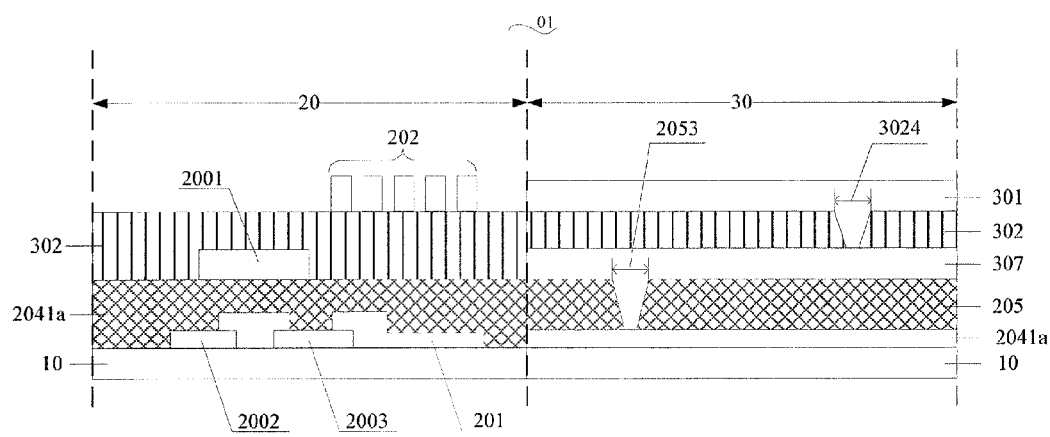
FIG. 6 is a cross-sectional view IV illustrating the pixel region and the via holes in the peripheral wiring region of the array substrate according to the embodiments of the present disclosure.

In addition, in a case where the thin film transistor is a thin film transistor of top gate type; the extension line of the data line is the data line lead 2041a, and the data line lead 2041a is disposed in a same layer with the data line 204, and the source electrode 2002 and the drain electrode 2003 of the thin film transistor, the array substrate according to the embodiments of the disclosure may further have the structures shown in FIG. 6.

As shown in FIG. 6, the transparent conductive contact electrode 301 is electrically connected with a gate electrode reserved pattern 307 through a seventh via hole 3024 disposed in the passivation layer 302, and the gate electrode reserved pattern 307 is electrically connected with the data line lead 2041a through an eighth via hole 2053 disposed in the gate insulating layer 205.

The passivation layer 302 is provided in the pixel region 20 and the peripheral wiring region 30, and the passivation layer 302 is provided above the gate electrode 2001 in the pixel region 20; the gate electrode reserved pattern 307 is disposed in a same layer with the gate electrode; the gate insulating layer 205 is provided in the pixel region 20 and the peripheral wiring region 30, and the gate insulating layer 205 is provided between the gate electrode 2001 and the source electrode 2002 as well as the drain electrode 2003 in the pixel region 20.

It should be noted that, in all the embodiments of the present disclosure, the expression "the passivation layer 302 is provided above the gate electrode 2001 in the pixel region 20" refers to that, the gate electrode 2001 is formed first and then the passivation layer 302 is formed during the fabrication process of the array substrate 01.

The transparent conductive contact electrode 301 is electrically connected with the gate electrode reserved pattern 307 through the seventh via hole 3024 disposed in the passivation layer 302, the gate electrode reserved pattern 307 is electrically connected with the data line lead 2041a through the eighth via hole 2053 disposed in the gate insulating layer 205, and the seventh via hole 3024 and the eighth via hole 2053 do not overlap in the vertical direction. Thus, the water vapor is prevented from corroding the data line lead 2041a in the case that the water vapor permeates into the transparent conductive contact electrode 301.

The pixel electrode 201 needs to be electrically connected with the drain electrode 2003, with reference to FIG. 3 to FIG. 6, the transparent conductive contact electrode 301 is disposed in the same layer with the common electrode 202 and the pixel electrode 201 is disposed between the common electrode 202 and the base substrate 10 in order to reduce the complexity of the fabrication process. Furthermore, the position of the pixel electrode 201 may be adjusted according to the type of the thin film transistor to reduce the complexity of process. It should be noted that, the array substrate according to the embodiments of the disclosure is not limited to the above-described structures, and the transparent conductive contact electrode 301 may be disposed in the same layer with the pixel electrode 201 and the common electrode 202 may be disposed between the pixel electrode 201 and the base substrate 10, which will not be repeated here.

Hereinafter, a specific example is provided to describe the above-mentioned array substrate in detail.

Figure 7:
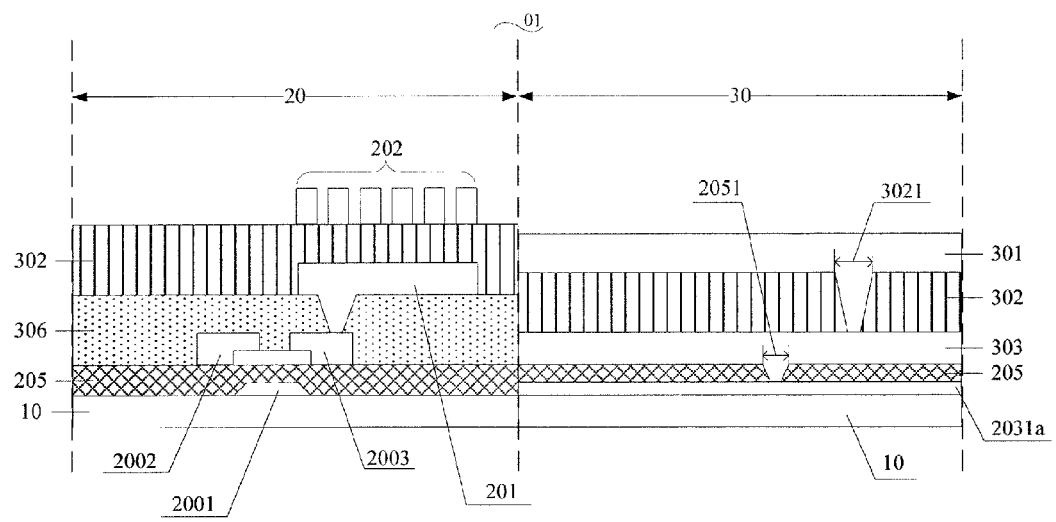
FIG. 7 is a cross-sectional view V illustrating the pixel region and the via holes in the peripheral wiring region of the array substrate according to the embodiments of the present disclosure.

As shown in FIG. 7, the array substrate 01 according to the embodiments of the disclosure comprises the pixel region 20 and the peripheral wiring region 30; the pixel region 20 comprises the thin film transistor of bottom gate type disposed on the base substrate 10, the pixel electrode 201 electrically connected with the drain electrode 2003 of the thin film transistor of bottom gate type, the common electrode 202 disposed above the pixel electrode 201, the gate line 203 and the data line 204 (not shown in FIG. 7).

Further, with reference to FIG. 7, the peripheral wiring region 30 comprises the transparent conductive contact electrode 301 and the gate line lead 2031a disposed on the base substrate 10. The transparent conductive contact electrode 301 and the common electrode 202 are disposed in a same layer and are formed by a single patterning process; and the gate line lead 2031a, the gate line 203, and the gate electrode 2001 are disposed in a same layer and are formed by a single patterning process.

The transparent conductive contact electrode 301 is electrically connected with the source-drain electrode reserved pattern 303 through the first via hole 3021 disposed in the passivation layer 302, the source-drain electrode reserved pattern 303 is electrically connected with the gate line lead 2031a through the second via hole 2051 disposed in the gate insulating layer 205, and the first via hole 3021 and the second via hole 2051 do not overlap with each other along the vertical direction of the array substrate 01. The source-drain electrode reserved pattern 303 and the source electrode and the drain electrode are disposed in a same layer and are formed by a single patterning process.

Here, the passivation layer 302 and the gate insulating layer 205 are provided in both the pixel region 20 and the peripheral wiring region 30; in the pixel region 20, the passivation layer 302 is provided between the pixel electrode 201 and the common electrode 202, and the gate insulating layer 205 is provided between the gate electrode 2001 and the source electrode 2002 as well as the drain electrode 2003.

In addition, since it is difficult for the water vapor permeating into the transparent conductive contact electrode 301 to pass through the two via holes (which do not overlapped with each other in the vertical direction) so as to arrive at the gate line lead 2031a, the gate line lead 2031a may be made of the metal alloy which has relatively strong corrosion resistance, such as the aluminum-neodymium alloy; or the gate line lead 2031a may be made of the metal element which has relatively weak corrosion resistance, such as molybdenum. In addition, since the source-drain electrode reserved pattern 303 is connected with the transparent conductive contact electrode 301 only through the first via hole 3021 so that the water vapor permeating into the transparent conductive contact electrode 301 may corrode the source-drain electrode reserved pattern 303, the source-drain electrode reserved pattern 303 may be made of the metal alloy which has relatively strong corrosion resistance, such as aluminum-neodymium alloy.

Thus, in the case that the water vapor permeates into the transparent conductive contact electrode 301 exposed outside and permeates downwardly through the first via hole 3021, there are limited molecules of water vapor able to permeate into the first via hole 3021 through the transparent conductive contact electrode 301 because a size of the first via hole 3021 per se is very small, and it is difficult for the limited molecules of the water vapor permeating to the first via hole 3021 to arrive at the second via hole 2051 because the second via hole 2051 and the first via hole 3021 do not overlap with each other in the vertical direction. Thus, the corrosion of the gate line lead 2031a disposed below the second via hole 2051 is prevented.

Furthermore, with reference to FIG. 5, the peripheral wiring region 30 further comprises the data line lead 2041a disposed on the base substrate 10, the data line lead 2041a and the data line 204, the source electrode 2002 and the drain electrode 2003 of the thin film transistor are disposed in a same layer, and are formed by a single patterning process.

In this case, the transparent conductive contact electrode 301 is electrically connected with the second transparent electrode reserved pattern 305 through the fifth via hole 3023 disposed in the passivation layer 302, and the second transparent electrode reserved pattern 305 is electrically connected with the data line lead 2041a through the sixth via hole 3061 disposed in the protective layer 306.

The second transparent electrode reserved pattern 305 and the pixel electrode 201 are disposed in the same layer, and are formed by a single patterning process; the protective layer 306 is provided in both the pixel region 20 and the peripheral wiring region 30, and is provided between the source electrode 2002 as well as the drain electrode 2003 and the pixel electrode 201 in the pixel region 20.

Thus, in the case that the water vapor permeates into the transparent conductive contact electrode 301 exposed outside, the corrosion of the data line lead 2041a disposed below the sixth via hole 3061 is prevented.

Embodiments of the present disclosure provide a display device, and the display device comprises any one of the array substrates described above.

The above-described liquid crystal display device for example is a liquid crystal display, a liquid crystal television, a digital photo frame, a mobile phone, a tablet personal computer, and any other product or component having a display function.

Embodiments of the present disclosure further provide a motherboard, the motherboard comprises at least one array substrate 01, and the array substrate 01 is any array substrate 01 described above.

Here, the motherboard refers to a relatively large substrate on which a plurality of array substrates 01 are formed in the fabrication process of the array substrates 01, and the plurality of array substrates 01 are separated from each other for example by a cutting process so that each of the plurality of array substrates 01 has a specific size. In addition, the array substrates 01 comprised in the motherboard are of a same type.

Figure 8:
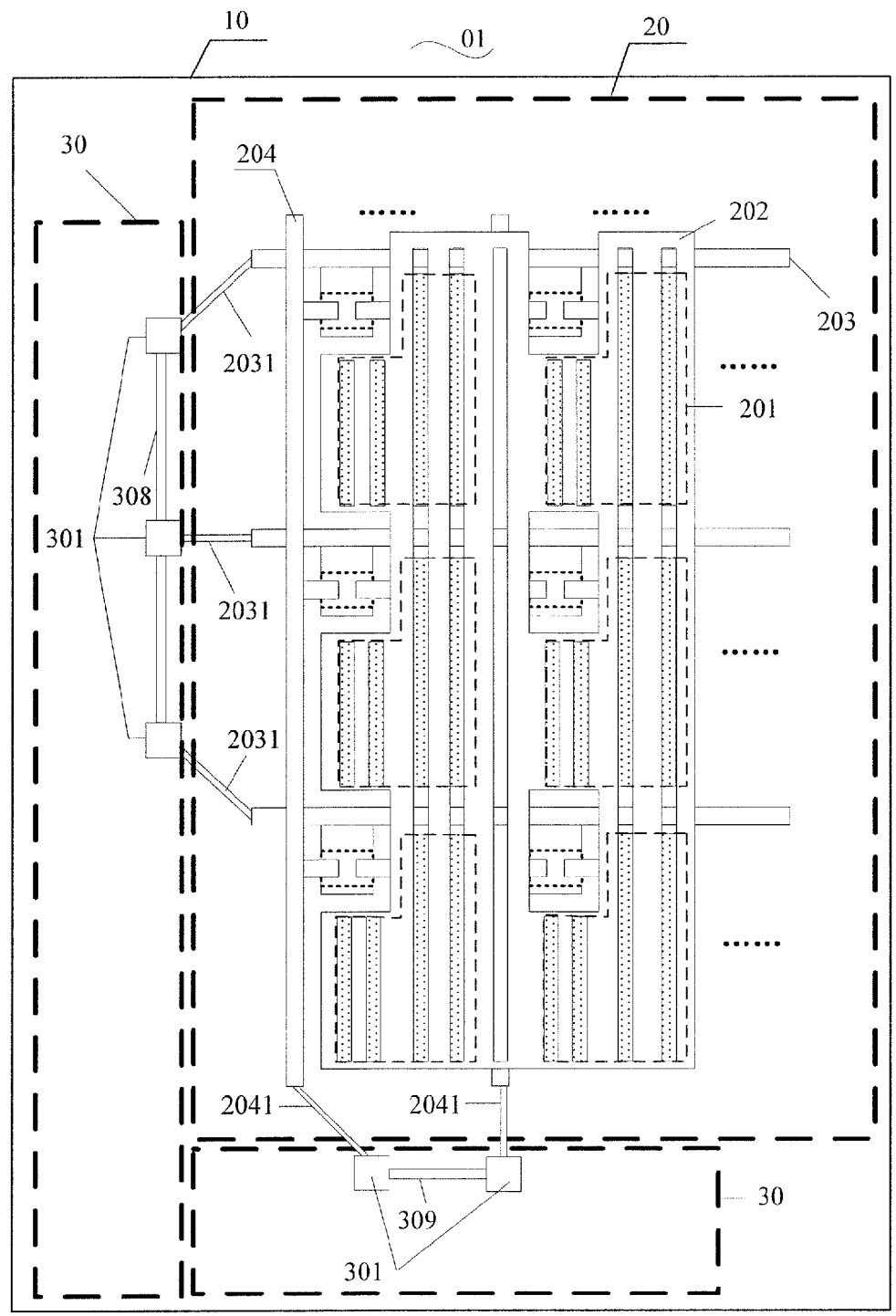
FIG. 8 is a partial top-view I illustrating a motherboard according to the embodiments of the present disclosure.

For example, as shown in FIG. 8, the motherboard further comprises: a test gate line 308 in parallel with the data line 204 of the array substrate 01 and electrically connected with the transparent conductive contact electrode 301; and/or, a test data line 309 in parallel with the gate line 203 of the array substrate 01 and electrically connected with the transparent conductive contact electrode 301. For example, the test gate line 308 and/or the test data line 309 are disposed in a same layer with the transparent conductive contact electrode 301. In addition, for example, the test gate line 308 and/or the test data line 309 and the transparent conductive contact electrode 301 are formed by a single patterning process.

The transparent conductive contact electrode 301 is electrically connected with the gate line lead 2031a and/or the data line lead 2041a through two via holes disposed in different insulating layers, and the gate line lead 2031a and the data line lead 2041a are respectively electrically connected with the gate line 203 and the data line 204. The transparent conductive contact electrodes 301 electrically connected with the gate line lead 2031a are electrically connected together by the test gate line 308; thus, the gate line 203 disposed below can be tested so as to determine whether the gate line is capable of being turned on or not. Similarly, the transparent conductive contact electrodes 301 electrically connected with the data line lead 2041a are electrically connected together by the test data line 309; thus, the data line 204 disposed below can be tested so as to determine whether the data line is capable of being turned on or not.

After the above-described test of the gate line and the data line is completed, the array substrate 01 is formed by cutting off the test gate line 308 and the test data line 309 from the transparent conductive contact electrode 301.

Figure 9:
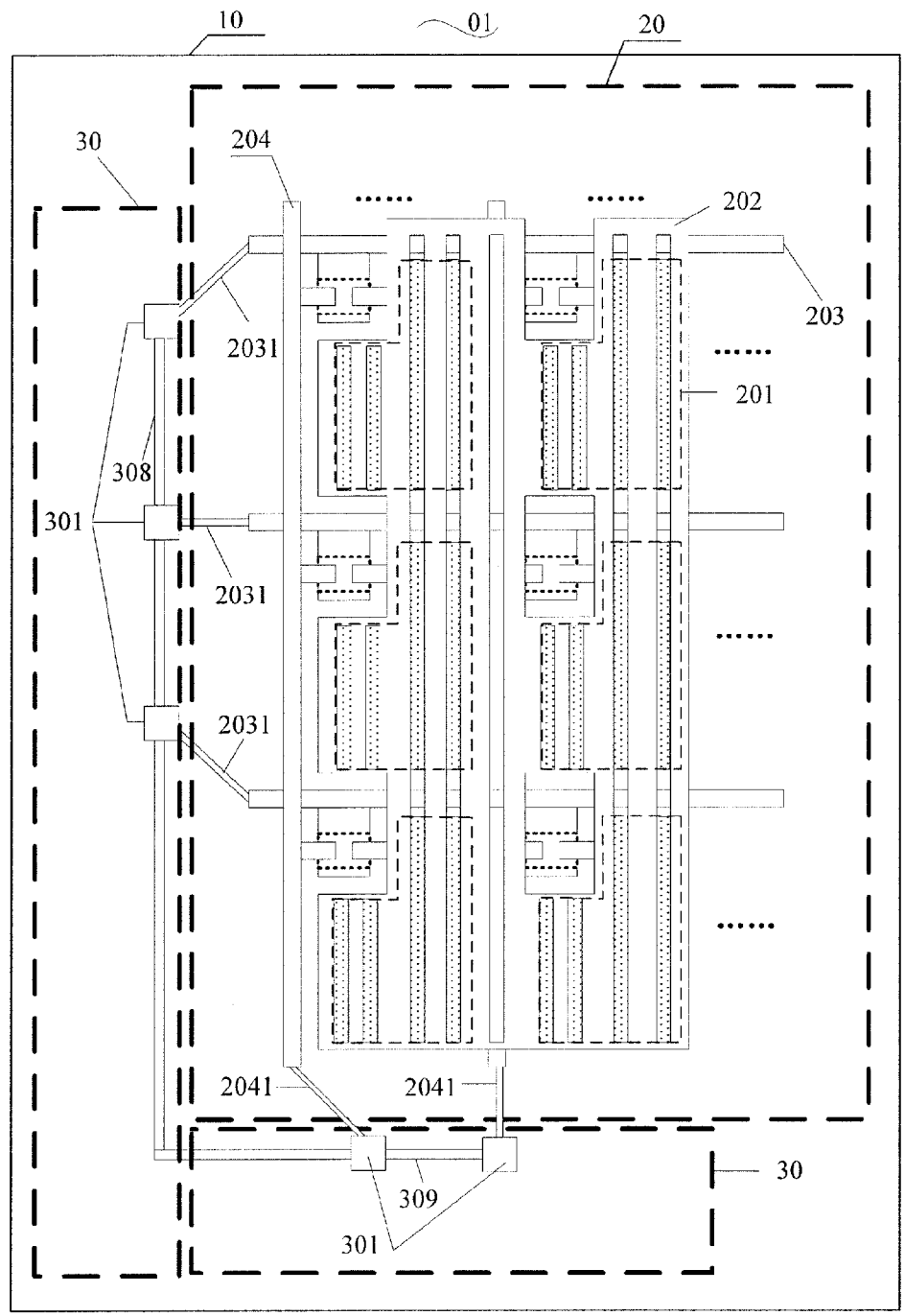
FIG. 9 is a partial top-view II illustrating the motherboard according to the embodiments of the present disclosure.

For example, as shown in FIG. 9, the test gate line 308 is electrically connected with the test data line 309, so that the potential of the gate line 203 electrically connected with the test gate line 308 and the potential of the data line 204 electrically connected with the test data line 309 in the motherboard maintain consistent, which avoids damage to the motherboard due to electrostatic potential difference generated in the motherboard.

Embodiments of the present disclosure further provide a fabrication method of the array substrate 01 as described above. The method comprises: forming a metal electrode line and a transparent conductive contact electrode 301 provided above the metal electrode line in a peripheral wiring region 30 surrounding a pixel region 20 of a base substrate 10. The transparent conductive contact electrode 301 is electrically connected with the metal electrode line through via holes disposed in different insulating layers, and the via holes provided in different insulating layers do not overlap with each other in a projection direction.

For example, the fabrication method further comprises: forming a thin film transistor, a common electrode 202 and a pixel electrode 201 electrically connected with a drain electrode 2003 of the thin film transistor in the pixel region 20 of the base substrate 10. The transparent conductive contact electrode 301 is disposed in a same layer with either the pixel electrode 201 or the common electrode 202 which is provided above.

Further, the forming the metal electrode line in the peripheral wiring region 30 of the base substrate 10, comprises: forming an extension line 2031 of a gate line and/or an extension line 2041 of a data line in the peripheral wiring region 30 of the base substrate 10.

For example, with reference to FIG. 3, the fabrication method I of the array substrate 01 comprises the following steps.

S11: forming a gate metal layer comprising a gate electrode 2001 and a gate line 203 (not shown in the diagram) provided in the pixel region 20 and a gate line lead 2031a provided in the peripheral wiring region on the base substrate 10.

S12: forming a gate insulating layer 205 provided in the pixel region 20 and the peripheral wiring region 30 and an active layer provided in the pixel region 20 sequentially on the base substrate where the gate metal layer has been formed; wherein a second via hole 2051 provided in the peripheral wiring region 30 is formed in the gate insulating layer 205, and the second via hole 2051 exposes the gate line lead 2031a.

S13: forming a source-drain metal layer comprising a source electrode 2002, a drain electrode 2003 and a data line 204 (not shown in the diagram) electrically connected with the source electrode 2002 provided in the pixel region 20 and a source-drain electrode reserved pattern 303 provided in the peripheral wiring region 30 on the base substrate where the gate insulating layer 205 and the active layer have been formed; wherein the source-drain electrode reserved pattern 303 is electrically connected with the gate line lead 2031a through the second via hole 2051.

S14: forming a passivation layer 302 on the base substrate where the source-drain metal layer has been formed; wherein a first via hole 3021 provided in the peripheral wiring region 30 is formed in the passivation layer 302, and the first via hole 3021 exposes the source-drain electrode reserved pattern 303.

S15: forming a first transparent electrode provided in the pixel region 20 and a transparent conductive contact electrode 301 provided in the peripheral wiring region 30 on the base substrate where the passivation layer 302 has been formed, wherein the transparent conductive contact electrode 301 is electrically connected with the source-drain electrode reserved pattern 303 through the first via hole 3021.

In addition, before forming the passivation layer 302, the fabrication method further comprises: forming a second transparent electrode provided in the pixel region 20 on the base substrate 10, i.e., the first transparent electrode is provided above the second transparent electrode on the base substrate 10; in addition, one of the first transparent electrode and the second transparent electrode is a pixel electrode 201, and the other is a common electrode 202.

Here, in a case where the first transparent electrode is the common electrode 202 and the second transparent electrode is the pixel electrode 201, with reference to FIG. 3, the pixel electrode 201 provided in the pixel region 20 is formed after the step S13 and before the step S14. In this case, in step S15, the common electrode 202 provided in the pixel region 20 and the transparent conductive contact electrode 301 provided in the peripheral wiring region 30 are formed.

It should be noted that, in a case that the second transparent electrode is the common electrode 202 and the first transparent electrode is the pixel electrode, it is necessary to ensure that the common electrode 202 is not electrically connected with the source electrode 2002 and the drain electrode 2003; and in this case, if the second transparent electrode is formed after the source electrode 2002 and the drain electrode 2003 and before the passivation layer 302, it is necessary to form an insulating layer to insulate the source electrode 2002 and the drain electrode 2003 from the second transparent electrode.

With reference to FIG. 3, the transparent conductive contact electrode 301 is electrically connected with the source-drain electrode reserved pattern 303 through the first via hole 3021, the source-drain electrode reserved pattern 303 is electrically connected with the gate line lead 2031a through the second via hole 2051, and the first via hole 3021 and the second via hole 2051 do not overlap each other in a vertical direction, so the water vapor is prevented from corroding the gate line lead 2031a in the case that the water vapor permeates into the transparent conductive contact electrode 301.

Since it is difficult for the water vapor permeating into the transparent conductive contact electrode 301 to pass through the first via hole 3021 and the second via hole 2051 (which do not overlap with each other in the vertical direction) so as to arrive at the gate line lead 2031a, the gate line lead 2031a may be made of a metal alloy which has relatively strong corrosion resistance such as an aluminum-neodymium alloy, or may be made of a metal element which has relatively weak corrosion resistance such as molybdenum. In addition, since the source-drain electrode reserved pattern 303 is connected with the transparent conductive contact electrode 301 through the second via hole 2051 so that the water vapor permeating into the transparent conductive contact electrode 301 may corrode the source-drain electrode reserved pattern 303, the source-drain electrode reserved pattern 303 may be made of the metal alloy which has relatively strong corrosion resistance such as an aluminum-neodymium alloy.

With reference to FIG. 4, the fabrication method II of the array substrate 01 for example comprises the following steps.

S21: forming a gate metal layer comprising a gate electrode 2001 and a gate line 203 (not shown in the diagram) provided in the pixel region 20 and a gate line lead 2031 provided in the peripheral wiring region 30 on the base substrate 10.

S22: forming a gate insulating layer 205 provided in the pixel region 20 and the peripheral wiring region 30 and an active layer provided in the pixel region 20 sequentially on the base substrate where the gate metal layer has been formed; wherein a fourth via hole 2052 provided in the peripheral wiring region 30 is formed in the gate insulating layer 205, and the fourth via hole 2052 exposes the gate line lead 2031a.

S23: forming a source-drain metal layer comprising a source electrode 2002, a drain electrode 2003 and a data line 204 (not shown in the diagram) electrically connected with the source electrode 2002 provided in the pixel region 20 on the base substrate where the gate insulating layer 205 and the active layer have been formed.

S24: forming a first transparent electrode provided in the pixel region 20 and a first transparent electrode reserved pattern 304 provided in the peripheral wiring region 30 on the base substrate where the source-drain metal layer has been formed; wherein, the first transparent electrode reserved pattern 304 is electrically connected with the gate line lead 2031a through the fourth via hole 2052.

S25: forming a passivation layer 302 on the substrate where the first transparent electrode and the first transparent electrode reserved pattern 304 have been formed; wherein, a third via hole 3022 provided in the peripheral wiring region 30 is formed in the passivation layer 302, and the third via hole 3022 exposes the first transparent electrode reserved pattern 304.

S26: forming a second transparent electrode provided in the pixel region 20 and a transparent conductive contact electrode 301 provided in the peripheral wiring region 30 on the base substrate where the passivation layer 302 has been formed; wherein, the transparent conductive contact electrode 301 is electrically connected with the first transparent electrode reserved pattern 304 through the third via hole 3022.

In addition, one of the first transparent electrode and the second transparent electrode is a pixel electrode 201, and the other is a common electrode 202.

In the case that the second transparent electrode is the common electrode 202 and the first transparent electrode is the pixel electrode 201, with reference to FIG. 4, the pixel electrode 201 provided in the pixel region 20 and the first transparent electrode reserved pattern 304 provided in the peripheral wiring region 30 are formed in step S24, and the common electrode 202 provided in the pixel region 20 and the transparent conductive contact electrode 301 provided in the peripheral wiring region 30 are formed in step S26.

In the case that the first transparent electrode is the common electrode 202 and the second transparent electrode is the pixel electrode 201, an insulating layer needs to be formed after step S23 and before step S24, so as to insulate the source electrode 2002 and the drain electrode 2003 from the first transparent electrode.

With reference to FIG. 4, the transparent conductive contact electrode 301 is electrically connected with the first transparent electrode reserved pattern 304 through the third via hole 3022, the first transparent electrode reserved pattern 304 is electrically connected with the gate line lead 2031a through the fourth via hole 2052, and the third via hole 3022 and the fourth via hole 2052 do not overlap each other in the vertical direction, so the water vapor is prevented from corroding the gate line lead 2031a in the case that the water vapor permeates into the transparent conductive contact electrode 301.

The first transparent electrode is generally made of a transparent conductive material such as Indium Tin Oxide (ITO), which has relatively high corrosion resistance per se; thus, the material of the first transparent electrode is not limited by the embodiments of the present disclosure.

With reference to FIG. 5, the fabrication method III of the array substrate 01 for example comprises the following steps.

S31: forming a gate metal layer comprising a gate electrode 2001 and a gate line 203 (not shown in the diagram) provided in the pixel region 20 on the base substrate 10.

S32: forming a gate insulating layer 205 provided in the pixel region 20 and the peripheral wiring region 30 and an active layer provided in the pixel region 20 sequentially on the base substrate where the gate metal layer has been formed.

S33: forming a source-drain metal layer comprising a source electrode 2002, a drain electrode 2003 and a data line 204 (not shown in the diagram) electrically connected with the source electrode 2002 provided in the pixel region 20, and a data line lead 2041a provided in the peripheral wiring region 30 on the base substrate where the gate insulating layer 205 and the active layer have been formed.

S34: forming a protective layer 306 on the base substrate where the source-drain metal layer has been formed; wherein, a sixth via hole 3061 provided in the peripheral wiring region 30 is formed in the protective layer 306, and the sixth via hole 3061 exposes the data line lead 2041a.

S35: forming a second transparent electrode provided in the pixel region 20 and a second transparent electrode reserved pattern 305 provided in the peripheral wiring region 30 on the base substrate where the protective layer 306 has been formed.

S36: forming a passivation layer 302 on the base substrate where the second transparent electrode and the second transparent electrode reserved pattern 305 have been formed; wherein, a fifth via hole 3023 provided in the peripheral wiring region 30 is formed in the passivation layer 302; and the fifth via hole 3023 exposes the second transparent electrode reserved pattern 305.

S37: forming a first transparent electrode provided in the pixel region 20 and a transparent conductive contact electrode 301 provided in the peripheral wiring region 30 on the base substrate where the passivation layer 302 has been formed, wherein the transparent conductive contact electrode 301 is electrically connected with the second transparent electrode reserved pattern 305 through the fifth via hole 3023.

In addition, one of the first transparent electrode and the second transparent electrode is a pixel electrode 201, and the other is a common electrode 202.

In the case that the second transparent electrode is the pixel electrode 201 and the first transparent electrode is the common electrode 202, with reference to FIG. 5, a via hole provided in the pixel region 20 is formed in the protective layer 306 in step S34 and the via hole exposes the drain electrode 2003, the pixel electrode 201 provided in the pixel region 20 and the second transparent electrode reserved pattern 305 provided in the peripheral wiring region 30 are formed in step S35 and the pixel electrode 201 is electrically connected with the drain electrode 2003 through the via hole, and the common electrode 202 provided in the pixel region 20 and the transparent conductive contact electrode 301 provided in the peripheral wiring region 30 are formed in step S37.

In the case that the first transparent electrode is the pixel electrode 201 and the second transparent electrode is the common electrode 202, it is necessary to form the via hole for connecting the pixel electrode 201 and the drain electrode 2003 in both of the protective layer 306 and the passivation layer 302 provided in the pixel region 20.

With reference to FIG. 5, the transparent conductive contact electrode 301 is electrically connected with the second transparent electrode reserved pattern 305 through the fifth via hole 3023, the second transparent electrode reserved pattern 305 is electrically connected with the data line lead 2041a through the sixth via hole 3061, and the fifth via hole 3023 and the sixth via hole 3061 do not overlap each other in the vertical direction, so the water vapor is prevented from corroding the data line lead 2041a in the case that the water vapor permeates into the transparent conductive contact electrode 301.

With reference to FIG. 6, the fabrication method IV of the array substrate 01 for example comprises the following steps.

S41: forming a source-drain metal layer comprising a source electrode 2002, a drain electrode 2003 and a data line 204 (not shown in the diagram) connected with the source electrode 2002 provided in the pixel region 20, and the data line lead 2041a provided in the peripheral wiring region 30 on the base substrate 10.

S42: forming an active layer provided in the pixel region 20 and a gate insulating layer 205 provided in the pixel region 20 and the peripheral wiring region 30 sequentially on the substrate where the source-drain metal layer has been formed; wherein, an eighth via hole 2053 provided in the peripheral wiring region 30 is formed in the gate insulating layer 205, and the eighth via hole 2053 exposes the data line lead 2041a.

S43: forming a gate metal layer comprising a gate electrode 2001 and a gate line 203 (not shown in the diagram) provided in the pixel region 20 and a gate electrode reserved pattern 307 provided in the peripheral wiring region 30 on the substrate where the gate insulating layer 205 has been formed.

S44: forming a passivation layer 302 on the substrate where the gate metal layer has been formed; wherein, a seventh via hole 3024 provided in the peripheral wiring region 30 is formed in the passivation layer 302, and the seventh via hole 3024 exposes the gate electrode reserved pattern 307.

S45: forming a first transparent electrode provided in the pixel region 20 and a transparent conductive contact electrode 301 provided in the peripheral wiring region 30 on the substrate where the passivation layer 302 has been formed, wherein the transparent conductive contact electrode 301 is electrically connected with the gate electrode reserved pattern 307 through the seventh via hole 3024.

In addition, before forming the passivation layer 302, the fabrication method further comprises: forming a second transparent electrode provided in the pixel region 20 on the base substrate 10. One of the first transparent electrode and the second transparent electrode is a pixel electrode 201, and the other is a common electrode 202.

In the case that the second transparent electrode is the pixel electrode 201 and the first transparent electrode is the common electrode 202, with reference to FIG. 6, the pixel electrode 201 provided in the pixel region 20 is formed after step S41 and before step S42, and the common electrode 202 provided in the pixel region 20 and the transparent conductive contact electrode 301 provided in the peripheral wiring region 30 are formed in step S45.

In the case that the first transparent electrode is the pixel electrode 201 and the second transparent electrode is the common electrode 202, an insulating layer and the common electrode 202 provided in the pixel region 20 are formed after step S43 and before step S44, and the pixel electrode 201 provided in the pixel region 20 and the transparent conductive contact electrode 301 provided in the peripheral wiring region 30 are formed in step S45.

With reference to FIG. 6, the transparent conductive contact electrode 301 is electrically connected with the gate electrode reserved pattern 307 through the seventh via hole 3024 disposed in the passivation layer 302, the gate electrode reserved pattern 307 is electrically connected with the data line lead 2041a through the eighth via hole 2053 disposed in the gate insulating layer 205, and the seventh via hole 3024 and the eighth via hole 2053 do not overlap with each other in the vertical direction, so the water vapor is prevented from corroding the data line lead 2041a in the case that the water vapor permeates into the transparent conductive contact electrode 301.

Since it is difficult for the water vapor permeating into the transparent conductive contact electrode 301 to pass through the seventh via hole 3024 and the eighth via hole 2053 (which do not overlap with each other in the vertical direction) so as to arrive at the data line lead 2041a, the data line lead 2041a may be made of a metal alloy which has relatively strong corrosion resistance such as an aluminum-neodymium alloy, or may be made of a metal element which has relatively weak corrosion resistance such as molybdenum. In addition, since the gate electrode reserved pattern 307 is connected with the transparent conductive contact electrode 301 through the seventh via hole 3024 and the water vapor permeating into the transparent conductive contact electrode 301 may corrode the gate electrode reserved pattern 307, so the gate electrode reserved pattern 307 may be made of a metal alloy which has relatively strong corrosion resistance such as an aluminum-neodymium alloy.

It should be noted that, a person of skill in the art should understand that all the accompanying drawings of the present disclosure are schematic diagrams of the array substrate, which are only intended to clearly describe the structures associated with the inventive point, while other structures not associated with the inventive point are not shown or only shown partially in the accompanying drawings.

It should be noted that, all the above-described embodiments describe the case where the peripheral wiring region is provided with two insulating layers and two via holes. However, according to practical requirements, the peripheral wiring region may be provided with a plurality of insulating layers, and in this case, a plurality of via holes not overlapping with each other in the projection direction and a plurality of conductive layers between the adjacent insulating layers should be disposed, which are all within the scope of the present disclosure.

The foregoing embodiments merely are exemplary embodiments of the disclosure, and not intended to define the scope of the disclosure, and the scope of the disclosure is determined by the appended claims.

The present application claims priority of Chinese Patent Application No. 201310741386.7 filed on Dec. 27, 2013, the disclosure of which is incorporated herein by reference in its entirety as part of the present application.

What is claimed is:

1. An array substrate, comprising a pixel region and a peripheral wiring region, wherein,
the peripheral wiring region comprises a transparent conductive contact electrode disposed on a base substrate, the transparent conductive contact electrode is electrically connected with a metal electrode line disposed below the transparent conductive contact electrode through via holes disposed in different insulating layers, and the via holes disposed in different insulating layers do not overlap with each other in a projection direction.

2. The array substrate according to claim 1, wherein the pixel region comprises a thin film transistor comprising a gate electrode, a source electrode and a drain electrode, a common electrode and a pixel electrode electrically connected with the drain electrode of the thin film transistor disposed on the base substrate; and
the transparent conductive contact electrode is disposed in a same layer with either the pixel electrode or the common electrode which is provided above.

3. The array substrate according to claim 2, wherein the pixel region further comprises a data line and a gate line disposed on the base substrate; and
the metal electrode line comprises an extension line of the gate line and/or an extension line of the data line.

4. The array substrate according to claim 3, wherein the thin film transistor is a thin film transistor of bottom gate type; the extension line of the gate line is a gate line lead, and the gate line lead is disposed in a same layer with the gate line and the gate electrode of the thin film transistor;
the transparent conductive contact electrode is electrically connected with a source-drain electrode reserved pattern through a first via hole disposed in a passivation layer, and the source-drain electrode reserved pattern is electrically connected with the gate line lead through a second via hole disposed in a gate insulating layer;

the passivation layer is provided in the pixel region and the peripheral wiring region, the passivation layer is provided between the pixel electrode and the common electrode in the pixel region, and the source-drain electrode reserved pattern is disposed in a same layer with the source electrode and the drain electrode; and the gate insulating layer is provided in the pixel region and the peripheral wiring region, the gate insulating layer is provided between the gate electrode and the source electrode as well as the drain electrode in the pixel region.

5. The array substrate according to claim 3, wherein
the thin film transistor is a thin film transistor of bottom gate type; the extension line of the gate line is a gate line lead, and the gate line lead is disposed in a same layer with the gate line and the gate electrode of the thin film transistor;

the transparent conductive contact electrode is electrically connected with a first transparent electrode reserved pattern through a third via hole disposed in a passivation layer, and the first transparent electrode reserved pattern is electrically connected with the gate line lead through a fourth via hole disposed in a gate insulating layer;

the passivation layer is provided in the pixel region and the peripheral wiring region, the passivation layer is provided between the pixel electrode and the common electrode in the pixel region, and the first transparent electrode reserved pattern is disposed in a same layer with either the pixel electrode or the common electrode which is provided below; and the gate insulating layer is provided in the pixel region and the peripheral wiring region, and the gate insulating layer is provided between the gate electrode and the source electrode as well as the drain electrode in the pixel region.

6. The array substrate according to claim 3, wherein
the thin film transistor is a thin film transistor of bottom gate type; the extension line of the data line is a data line lead, and the data line lead is disposed in a same layer with the data line, and the source electrode and the drain electrode of the thin film transistor;

the transparent conductive contact electrode is electrically connected with a second transparent electrode reserved pattern through a fifth via hole disposed in a passivation layer, and the second transparent electrode reserved pattern is electrically connected with the data line lead through a sixth via hole disposed in a protective layer;

the passivation layer is provided in the pixel region and the peripheral wiring region, and the passivation layer is provided between the pixel electrode and the common electrode in the pixel region; the second transparent electrode reserved pattern is disposed in a same layer with either the pixel electrode or the common electrode which is provided below; and the protective layer is provided in the pixel region and the peripheral wiring region, and the protective layer is provided between the source electrode as well as the drain electrode and either the pixel electrode or the common electrode which is provided below.

7. The array substrate according to claim 3, wherein
the thin film transistor is a thin film transistor of top gate type; the extension line of the data line is a data line lead, and the data line lead is disposed in a same layer with the data line, and the source electrode and the drain electrode of the thin film transistor;

the transparent conductive contact electrode is electrically connected with a gate electrode reserved pattern through a seventh via hole disposed in a passivation layer, and the gate electrode reserved pattern is electrically connected with the data line lead through an eighth via hole disposed in a gate insulating layer;

the passivation layer is provided in the pixel region and the peripheral wiring region, and the passivation layer is provided above the gate electrode in the pixel region; the gate electrode reserved pattern is disposed in a same layer with the gate electrode; and the gate insulating layer is provided in the pixel region and the peripheral wiring region, and the gate insulating layer is provided between the gate electrode and the source electrode as well as the drain electrode in the pixel region.

8. The array substrate according to claim 2, wherein
the transparent conductive contact electrode is disposed in a same layer with the common electrode; and the pixel electrode is disposed between the common electrode and the base substrate.

9. The array substrate according to claim 2, wherein
the transparent conductive contact electrode is disposed in a same layer with the pixel electrode; and the common electrode is disposed between the pixel electrode and the base substrate.

10. A fabrication method of an array substrate according to claim 1, comprising: forming a metal electrode line and a transparent conductive contact electrode provided above the metal electrode line in a peripheral wiring region surrounding a pixel region of a base substrate, wherein the transparent conductive contact electrode is electrically connected with the metal electrode line through via holes provided in different insulating layers, and the via holes provided in different insulating layers do not overlap with each other in a projection direction.

11. The fabrication method according to claim 10, wherein the fabrication method further comprises:
forming a thin film transistor comprising a gate electrode, a source electrode and a drain electrode, a common electrode and a pixel electrode electrically connected with the drain electrode of the thin film transistor in the pixel region of the base substrate;

wherein the transparent conductive contact electrode is formed in a same layer with either the pixel electrode or the common electrode which is provided above.

12. The fabrication method according to claim 11, wherein
the forming the metal electrode line in the peripheral wiring region of the base substrate comprises: forming an extension line of a gate line and/or an extension line of a data line in the peripheral wiring region of the base substrate.

13. The fabrication method according to claim 12, wherein the fabrication method comprises:
forming a gate metal layer comprising the gate electrode and the gate line provided in the pixel region and a gate line lead provided in the peripheral wiring region on the base substrate, wherein the gate line lead is the extension line of the gate line;

forming a gate insulating layer provided in the pixel region and the peripheral wiring region and an active layer provided in the pixel region sequentially on the base substrate where the gate metal layer has been formed; wherein a second via hole provided in the peripheral wiring region is formed in the gate insulating layer and the second via hole exposes the gate line lead;

forming a source-drain metal layer comprising the source electrode, the drain electrode and the data line electrically connected with the source electrode provided in the pixel region and a source-drain electrode reserved pattern provided in the peripheral wiring region on the base substrate where the gate insulating layer and the active layer have been formed; wherein the source-drain electrode reserved pattern is electrically connected with the gate line lead through the second via hole;

forming a passivation layer on the base substrate where the source-drain metal layer has been formed; wherein a first via hole provided in the peripheral wiring region is formed in the passivation layer and the first via hole exposes the source-drain electrode reserved pattern; and forming a first transparent electrode provided in the pixel region and the transparent conductive contact electrode provided in the peripheral wiring region on the base substrate where the passivation layer has been formed, wherein the transparent conductive contact electrode is electrically connected with the source-drain electrode reserved pattern through the first via hole, wherein before forming the passivation layer, the fabrication method further comprises: forming a second transparent electrode provided in the pixel region on the base substrate;

one of the first transparent electrode and the second transparent electrode is the pixel electrode, and the other is the common electrode.

14. The fabrication method according to claim 12, wherein the fabrication method comprises:

forming a gate metal layer comprising the gate electrode and the gate line provided in the pixel region and a gate line lead provided in the peripheral wiring region on the base substrate, wherein the gate line lead is the extension line of the gate line;

forming a gate insulating layer provided in the pixel region and the peripheral region and an active layer provided in the pixel region sequentially on the base substrate where the gate metal layer has been formed; wherein a fourth via hole provided in the peripheral wiring region is formed in the gate insulating layer, and the fourth via hole exposes the gate line lead;

forming a source-drain metal layer comprising the source electrode, the drain electrode and the data line electrically connected with the source electrode provided in the pixel region on the base substrate where the gate insulating layer and the active layer have been formed;

forming a first transparent electrode provided in the pixel region and a first transparent electrode reserved pattern provided in the peripheral wiring region on the base substrate where the source-drain metal layer has been formed; wherein the first transparent electrode reserved pattern is electrically connected with the gate line lead through the fourth via hole;

forming a passivation layer on the base substrate where the first transparent electrode and the first transparent electrode reserved pattern have been formed; wherein a third via hole provided in the peripheral wiring region is formed in the passivation layer, and the third via hole exposes the first transparent electrode reserved pattern; and forming a second transparent electrode provided in the pixel region and the transparent conductive contact electrode provided in the peripheral wiring region on the base substrate where the passivation layer has been formed; wherein the transparent conductive contact electrode is electrically connected with the first transparent electrode reserved pattern through the third via hole, wherein one of the first transparent electrode and the second transparent electrode is the pixel electrode, and the other is the common electrode.

15. The fabrication method according to claim 12, wherein the fabrication method comprises:

forming a gate metal layer comprising the gate electrode and the gate line provided in the pixel region on the base substrate;

forming a gate insulating layer provided in the pixel region and the peripheral region and an active layer provided in the pixel region sequentially on the base substrate where the gate metal layer has been formed;

forming a source-drain metal layer comprising the source electrode, the drain electrode and the data line electrically connected with the source electrode provided in the pixel region and a data line lead provided in the peripheral wiring region on the base substrate where the gate insulating layer and the active layer have been formed, wherein the data line lead is the extension line of the data line;

forming a protective layer on the base substrate where the source-drain metal layer has been formed; wherein a sixth via hole provided in the peripheral wiring region is formed in the protective layer, and the sixth via hole exposes the data line lead;

forming a second transparent electrode provided in the pixel region and a second transparent electrode reserved pattern provided in the peripheral wiring region on the base substrate where the protective layer has been formed;

forming a passivation layer on the base substrate where the second transparent electrode and the second transparent electrode reserved pattern have been formed; wherein a fifth via hole provided in the peripheral wiring region is formed in the passivation layer, and the fifth via hole exposes the second transparent electrode reserved pattern;

forming a first transparent electrode provided in the pixel region and the transparent conductive contact electrode provided in the peripheral wiring region on the base substrate where the passivation layer has been formed, wherein the transparent conductive contact electrode is electrically connected with the second transparent electrode reserved pattern through the fifth via hole;

wherein one of the first transparent electrode and the second transparent electrode is the pixel electrode, and the other is the common electrode.

16. The fabrication method according to claim 12, wherein the fabrication method comprises:

forming a source-drain metal layer comprising the source electrode, the drain electrode and the data line connected with the source electrode provided in the pixel region and a data line lead provided in the peripheral wiring region on the base substrate, wherein the data line lead is the extension line of the data line;

forming an active layer provided in the pixel region and a gate insulating layer provided in the pixel region and the peripheral region sequentially on the base substrate where the source-drain metal layer has been formed;

wherein an eighth via hole provided in the peripheral wiring region is formed in the gate insulating layer, and the eighth via hole exposes the data line lead;

forming a gate metal layer comprising the gate electrode and the gate line provided in the pixel region and a gate electrode reserved pattern provided in the peripheral wiring region on the base substrate where the gate insulating layer has been formed;

forming a passivation layer on the base substrate where the gate metal layer has been formed; wherein a seventh via hole provided in the peripheral wiring region is formed in the passivation layer, and the seventh via hole exposes the gate electrode reserved pattern;

forming a first transparent electrode provided in the pixel region and the transparent conductive contact electrode provided in the peripheral wiring region on the base substrate where the passivation layer has been formed, wherein the transparent conductive contact electrode is electrically connected with the gate electrode reserved pattern through the seventh via hole;

wherein before forming the passivation layer, the fabrication method further comprises: forming a second transparent electrode provided in the pixel region on the base substrate; and one of the first transparent electrode and the second transparent electrode is the pixel electrode, and the other is the common electrode.

17. A motherboard, comprising at least one array substrate, wherein the array substrate is an array substrate according to claim 1.

18. The motherboard according to claim 17, further comprising:

a test gate line in parallel with a data line of the array substrate, and electrically connected with a transparent conductive contact electrode; and/or, a test data line in parallel with a gate line of the array substrate, and electrically connected with the transparent conductive contact electrode;

wherein, the test gate line and/or the test data line are disposed in a same layer with the transparent conductive contact electrode.

19. The motherboard according to claim 18, wherein the test gate line and the test data line are electrically connected with each other.

* * * * *